(12) United States Patent
Guadagnuolo et al.

(10) Patent No.: US 7,998,319 B2
(45) Date of Patent: Aug. 16, 2011

(54) PROCESS FOR THE FORMATION OF MINIATURIZED GETTER DEPOSITS AND GETTER DEPOSITS SO OBTAINED

(75) Inventors: Sara Guadagnuolo, Monza (IT); Marco Moraja, Milan (IT); Andrea Conte, Milan (IT)

(73) Assignee: Saes Getters S.p.A., Lainate MI (IT)

( * ) Notice: Subject to any disclaimer, the term of this patent is extended or adjusted under 35 U.S.C. 154(b) by 977 days.

(21) Appl. No.: 11/911,065

(22) PCT Filed: Apr. 11, 2006

(86) PCT No.: PCT/IT2006/000242
§ 371 (c)(1),
(2), (4) Date: Oct. 9, 2007

(87) PCT Pub. No.: WO2006/109343
PCT Pub. Date: Oct. 19, 2006

(65) Prior Publication Data
US 2008/0171180 A1   Jul. 17, 2008

(30) Foreign Application Priority Data

Apr. 12, 2005  (IT) .............................. MI2005A0616

(51) Int. Cl.
C23C 14/34 (2006.01)
C23C 14/14 (2006.01)
(52) U.S. Cl. .......... 204/192.12; 204/192.15; 204/192.25
(58) Field of Classification Search ............. 204/192.15, 204/192.25
See application file for complete search history.

(56) References Cited

U.S. PATENT DOCUMENTS

| | | | |
|---|---|---|---|
| 5,594,170 A | 1/1997 | Peters | |
| 5,656,778 A | 8/1997 | Roszhart | |
| 5,658,469 A | 8/1997 | Jennison | |
| 5,705,432 A | 1/1998 | Lee et al. | |
| 5,821,836 A | 10/1998 | Katehi et al. | |

(Continued)

FOREIGN PATENT DOCUMENTS

EP  0341843 A2  11/1989

(Continued)

OTHER PUBLICATIONS

Papanicolaou, N. A. et al.; Low-noise MESFET with sputtered amorphous metal gate defined by lift-off; Inst. Phys. Conf.; Ser. No. 65, pp. 407-414 (1983); paper presented at Int. Symp. GaAs and Related Compounds, Albuquerque, New Mexico (1982).

Radulescu, F. et al.; Introduction of complete sputtering metallization in conjunction with $CO_2$ snow lift-off for high volume GaAs manufacturing; Proceedings of 2002 GaAs Mantech Conference.; article 11a.

*Primary Examiner* — Kishor Mayekar
(74) *Attorney, Agent, or Firm* — Panitch Schwarze Belisario & Nadel LLP

(57) ABSTRACT

A process is provided for the formation of miniaturized getter deposits, comprising the steps of forming a layer of a photosensitive polymeric material on a support; selectively exposing the polymeric layer in order to cause a chemical modification in a portion of the polymeric layer; removing with a first solvent only one of the previously exposed or the not previously exposed portions of the polymeric layer, thus forming cavities in the polymeric layer; forming a thin layer of a getter material by cathodic deposition at the bottom of the cavity and on the residual polymer; and removing with a second solvent the polymer portion not removed by the first solvent, leaving at least a getter material deposit on the support surface.

14 Claims, 2 Drawing Sheets

U.S. PATENT DOCUMENTS

| | | |
|---|---|---|
| 5,895,233 A | 4/1999 | Higashi et al. |
| 5,952,572 A | 9/1999 | Yamashita et al. |
| 6,058,027 A | 5/2000 | Vargha et al. |
| 6,499,354 B1 | 12/2002 | Najafi et al. |
| 6,590,850 B2 | 7/2003 | Eldredge et al. |
| 6,621,134 B1 | 9/2003 | Zurn |
| 6,635,509 B1 | 10/2003 | Ouellet |
| 2003/0138656 A1 | 7/2003 | Sparks |

FOREIGN PATENT DOCUMENTS

| | | |
|---|---|---|
| EP | 1518599 A2 | 3/2005 |
| JP | 2002-043248 A | 2/2002 |
| WO | 03/043062 A1 | 5/2003 | a)

b)

c)

d)

e)

f)

g)

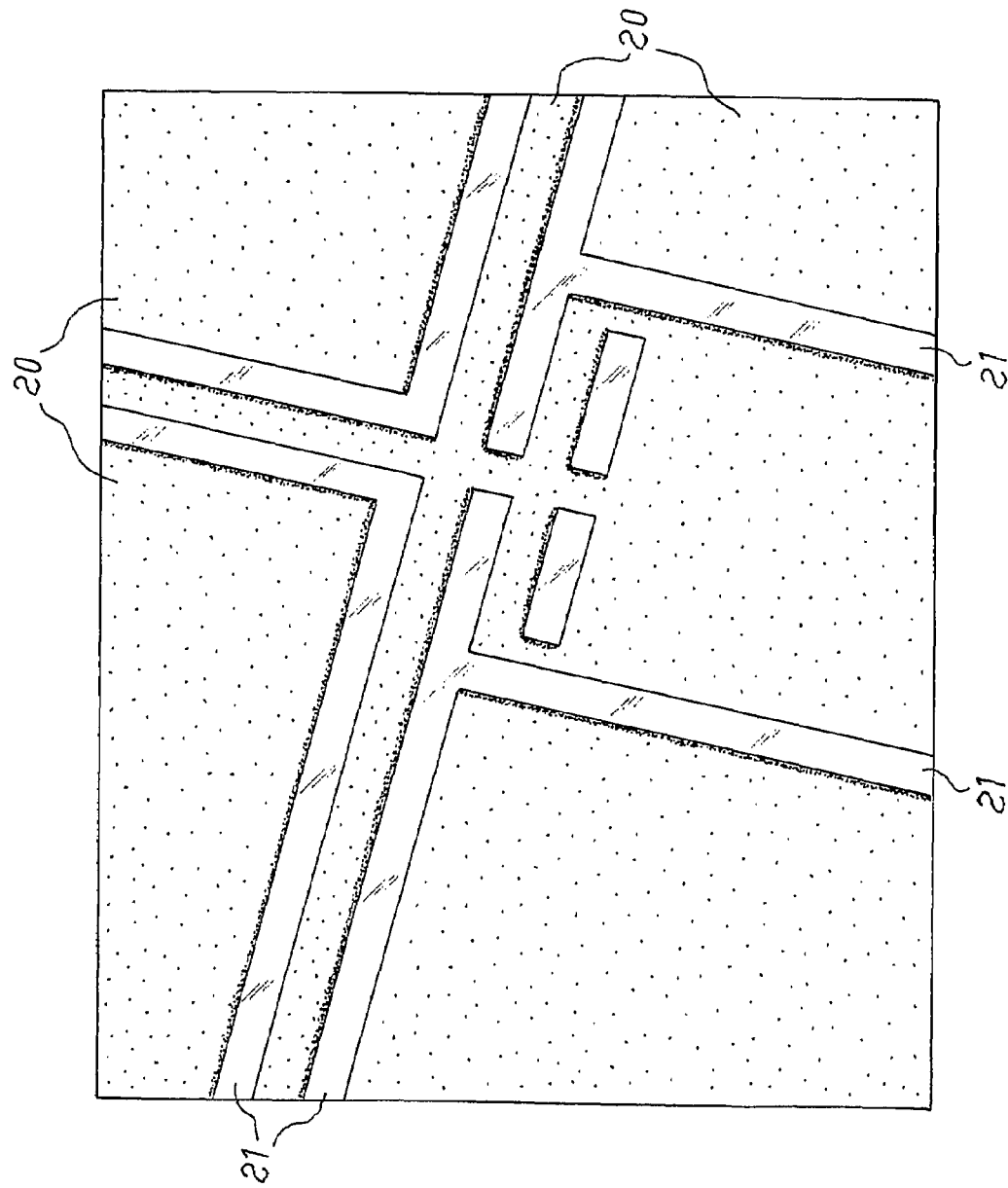

PROCESS FOR THE FORMATION OF MINIATURIZED GETTER DEPOSITS AND GETTER DEPOSITS SO OBTAINED

CROSS-REFERENCE TO RELATED APPLICATIONS

This application is a Section 371 of International Application No. PCT/IT2006/000242, filed Apr. 11, 2006, which was published in the English language on Oct. 19, 2006, under International Publication No. WO 2006/109343, the disclosure of which is incorporated herein by reference.

BACKGROUND OF THE INVENTION

The present invention relates to a process for the formation of miniaturized deposits of getter materials, namely, deposits having lateral dimensions of less than one millimeter, and generally from a few micrometers to hundreds of micrometers. The invention also relates to deposits of getter materials so obtained.

The getter materials have the characteristic of being able to fix gaseous traces, such as hydrogen, oxygen, carbon oxides, water vapor and, in some cases, nitrogen. These materials are generally metals belonging to the III, IV and V transition groups (groups of the scandium, titanium and vanadium metals) or alloys thereof with other elements, generally transition metals or aluminum. The most widely employed getter materials are titanium-based alloys and, in particular, zirconium-based alloys.

A recent field of use of getter materials is represented by the micromechanical devices, generally known in the field as "MicroElectroMechanical Systems" or "MicroOptoElectroMechanical Systems," and with the abbreviations MEMS and MOEMS (in the following reference to MEMS will only be made, also meaning the MOEMS). These devices comprise a sealed cavity inside which a micromechanical part able to perform a predefined movement or parts able to interact with an electromagnetic radiation are present, in addition to auxiliary parts and electrical feedthroughs both for supplying the device and for the transmission of signals to the outside. Examples of these devices are the microaccelerometers, described in numerous patents, such as U.S. Pat. Nos. 5,594,170; 5,656,778 and 5,952,572; the miniaturized resonators, used in the telecommunications field and particularly in the manufacturing of mobile phones, described in U.S. Pat. Nos. 5,821,836 and 6,058,027; or the miniaturized IR sensors, an example of which is described in U.S. Pat. No. 5,895,233.

At the end of the manufacturing process, several gases are contained in the cavity of a MEMS (being residual of the process or due to the degassing of the cavity walls themselves), which may interfere with the MEMS operation. For example, they can alter the movement of the movable micromechanical parts (by modifying the viscosity of the medium in which the part is moving) or modify the thermal conduction in the system, thus altering the temperature measurement in the case of an IR sensor.

It is thereby necessary to introduce into the cavity a getter material, capable of removing these gases. The use of getter materials in MEMS devices is described, for example, in U.S. Pat. Nos. 5,952,572; 6,499,354; 6,590,850; 6,621,134; and 6,635,509 and in U.S. patent application publication U.S. 2003/0138656 A1.

In the last generation MEMS the cavity has extremely reduced dimensions, and the getter can be inserted only in the form of a thin layer, being of lateral dimensions between hundreds of micrometers ($\mu m$) and a few millimeters, and with thicknesses varying between fractions of $\mu m$ and a few $\mu m$. In addition, the MEMS are manufactured with technologies derived from those of semiconductors, where thousands of miniaturized devices are simultaneously manufactured on a single support (commonly a silicon wafer), by means of localized deposits and selective removals of layers of different materials. For these productions, it is necessary to be able to grant both dimensional and positioning precision of the various layers deposited, and this also applies to the deposits of getter materials.

A technique allowing the production of thin deposits with a high precision of dimensions and of deposit positioning is the one known as "lift-off," which consists in forming a layer of photohardening polymeric material on a support (these materials are known in the field as "resist"); selectively exposing the polymeric layer by means of a mask, generally to UV radiations; selectively removing with a first solvent the previously unexposed part (or the exposed one, according to the resist and the solvent type); depositing on the support and on the resist not removed by the first solvent a thin layer of the desired material, e.g., a metal or an oxide; and finally removing, with a second solvent, the resist previously polymerized by light, thus leaving on the support deposits of the desired material only in the proximity of the apertures formed by the first solvent on the resist layer. As a deposition technique, evaporation is nearly exclusively used in processes of the lift-off type, as set forth, for example, in European patent application publication EP 341,843 and International patent application publication WO 03/043062. This technique is, however, poorly suitable for the deposition of getter material layers, because the deposited layer becomes compact and thereby without the characteristics of great surface and porosity necessary for obtaining the getter functionality.

For the production of getter material layers, it is preferable to use the cathodic deposition technique, commonly referred to as "sputtering." In this technique, the support on which forming the thin layer is desired and a "target" of the material desired to be deposited are arranged in a process chamber; the chamber is first evacuated and subsequently filled with a noble gas atmosphere, commonly argon or krypton, at a pressure generally comprised between about 0.01 and 0.1 Pascal (Pa); by applying a potential difference of some thousands of volts between the support holder and the target holders (so that the latter is at the cathodic potential), a plasma of ions ($Ar^+$ or $Kr^+$) is created, which are accelerated by the electric field toward the target, causing impact erosion thereof; the species (generally atoms or clusters of atoms) resulting from the erosion of the target deposit on the support, thus forming the thin layer. With a proper definition of the process parameters, this technique can be suitable for the formation of getter material layers.

However, as it is well known in the field of deposition of thin layers, the use of sputtering in lift-off processes is troublesome.

A first problem occurring is that, during sputtering, an overheating of the resist and consequent hardening thereof take place, whereby the resist layer can no longer be removed with solvents; the problem is well known in the field, and is described, e.g., in the article "Low-noise MESFET with sputtered amorphous metal gate defined by lift-off," by N. A. Papanicolaou et al., *Inst. Phys. Conf. Ser.* No. 65, pags 407-414 (see pag. 411 in particular). In order to overcome the problem, this article suggests cooling the support during the deposition at a temperature of about 10° C. However, in addition to rendering the apparatus complex, this has the consequence of reducing the density of the deposited layer, which is an effect not generally desired in productions where lift-off is adopted.

The second problem of the use of sputtering is that in this technique the material deposition is not directional, i.e., the material deposits on the support in all directions rather than in a preferential direction (as happens, in contrast, with evaporation). This characteristic causes the target material to deposit uniformly on all the available surfaces, forming a continuous layer on the upper surface of the resist, at the bottom of the cavities formed in the resist (i.e., on the support exposed zones) and on the lateral walls, made of resist, of these cavities. The continuity of the deposited layer prevents the subsequent access of the second solvent to the resist and hence the removal thereof from the support surface. The problem is tackled in numerous documents of the prior art, offering various solutions which, however, always require the use of particular expedients.

A first expedient is to provide that a recess (known in the field as "undercut" or "notch") is present under the resist layer along the whole periphery of the cavity, sufficiently deep to be only barely filled with the material being deposited; in this way the continuity of the deposited layer is interrupted, thus leaving a way of access to the solvent in order to reach the contact zone between the resist and the support surface. However, the formation of the recess generally requires that the resist layer actually be a double layer of different polymeric materials, with different solubility characteristics in different solvents, so that the lower layer (the one in direct contact with the support) is attacked by the first solvent more rapidly than the upper one; this approach is illustrated, for example, in U.S. Pat. No. 5,705,432 and in patent application publications EP 341,843 and WO 03/043062. The article "Introduction of complete sputtering metallization in conjunction with $CO_2$ snow lift-off for high volume GaAs manufacturing" by F. Radulescu et al., article 11a of the *Proceedings of 2002 GaAs Mantech Conference*, suggests, in addition to the use of a double layer resist, a treatment after the deposition by sputtering with $CO_2$ "snow" causing a thermal differential dilation between the resist and the deposited material on the upper surface thereof, in order to detach the deposit on the resist and to expose the latter to the solvent attack. Finally, U.S. Pat. No. 5,658,469 suggests for the formation of the undercut a sequence of irradiations of the resist with electron beams of different powers in order to make the upper part of the resist less soluble in a solvent with respect to the lower one, so that afterwards the latter can be preferentially removed.

In order to improve the sputtering directivity, it is also possible to move the support away from the target and interpose between the two parts a collimator, that is a mechanical filter, intercepting the particles moving in directions non-perpendicular (or nearly so) to the support, but these measures reduce the amount of material deposited on the support with respect to the one removed from the target, leading to waste of material, to the need for replacing the target more frequently, and, in short, an increase in process costs.

Finally, as set forth in Japanese patent application publication JP 2002-043248, in order to use in lift-off processes the deposition by sputtering, it is required that the latter occur at very low pressures, for example in the range of 0.1 Pa; this causes an increase in the energy of the "sputtered" atoms and a consequent increase in the temperature of the layer being deposited, as well as of the material laying under the deposit, with a double negative effect on the process. On the one hand, thermohardening of the resist occurs, which is afterwards more difficult (or impossible) to remove with solvents and, on the other hand, the getter material layer tends to grow too compact, and thereby without the necessary morphologic characteristics.

As a consequence of these process complications, the sputtering deposition technique does not have practical industrial application as the deposition operation in lift-off processes.

BRIEF SUMMARY OF THE INVENTION

An object of the present invention is to provide a lift-off process for the formation of miniaturized getter deposits, wherein the deposition operation of the getter material is carried out by sputtering, being free from the drawbacks of the prior art.

According to the present invention, these and other advantages are obtained by a lift-off process comprising the following steps:
  forming a layer of a photosensitive polymeric material on a support;
  selectively exposing to light at least a portion of the polymeric layer in order to cause a chemical modification in the polymeric layer portion;
  removing with a first solvent only one of the previously exposed or the not previously exposed portion of the polymeric layer, forming in the polymeric layer at least one cavity whose bottom wall is formed by the surface of the support;
  forming by cathodic deposition a thin layer of a getter material at the bottom of the cavity and on the portion of the polymer layer not removed by the first solvent; and
  removing with a second solvent the polymer portion not removed by the first solvent, leaving at least a getter material deposit on the support surface;
  the process being characterized in that the cathodic deposition operation is not preceded by either operations or treatments for the formation of recesses in the lower part of the polymeric layer, and in that the cathodic deposition operation is carried out with a chamber pressure comprised between about 1 and 5 Pa and with a specific power comprised between 6 and 13 W per square centimeter of area of the target actually interested by the plasma.

The main difference between the sputtering conditions used in the process of the present invention and those normally used in industrial processes, in particular in the semiconductor industry, is that in the present invention the pressure maintained in the sputtering chamber is 1 or 2 orders of magnitude greater. Thus, while in the present invention the operating pressure is greater than 1 Pa, in known processes this pressure is generally comprised between about 0.01 and 0.1 Pa.

Also, the specific power on the target in the process of the invention has different characteristic values from those typically used in sputtering processes, which are generally comprised between about 20 and 40 $W/cm^2$. As used in the present specification and in the claims, specific power is defined to be the power applied divided by the area of the target portion which is in contact with the plasma of ions of the noble gas employed. It is well known in the field that the target zone actually interested by the plasma is only a fraction of the surface of the same, which can have the geometry of a circular crown in the simplest case, but can have more complex geometries. The geometry of the zone actually interested by the plasma can be controlled, e.g., by magnetic fields ("magnetron" mode sputtering, well known by those skilled in the art), and it is also known that it is possible to move the zone involved during the process, in order to have, on average, a more uniform erosion of the target. However, at every moment and in every operating mode it is possible to know the actual area of the portion of the target on which the plasma acts, which is the important area for calculation and control of the specific power according to the present invention.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 2 is a perspective view of a support with a plurality of getter deposits obtained with the process of the invention.

DETAILED DESCRIPTION OF THE INVENTION

Figure 1:
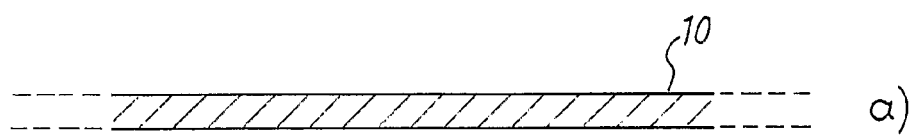
FIG. 1 is a schematic representation of the main steps of the lift-off process of the invention.
Figure 1:
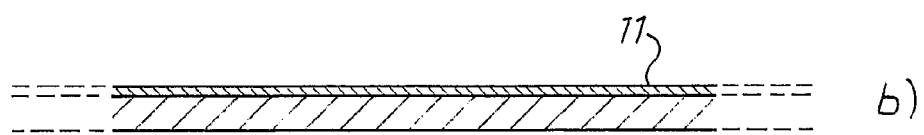
Figure 1:
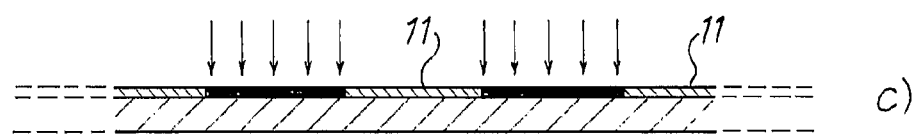
Figure 1:
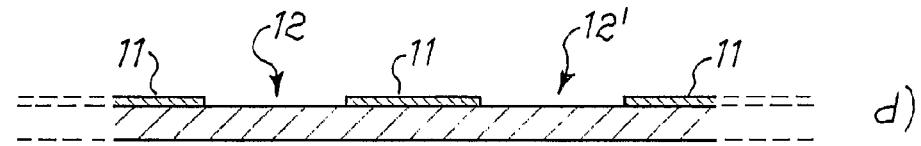
Figure 1:
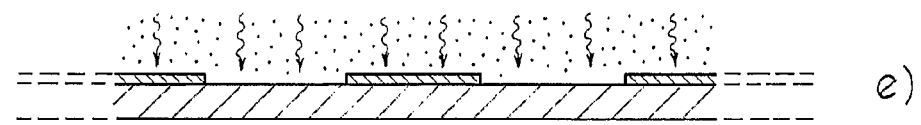
Figure 1:
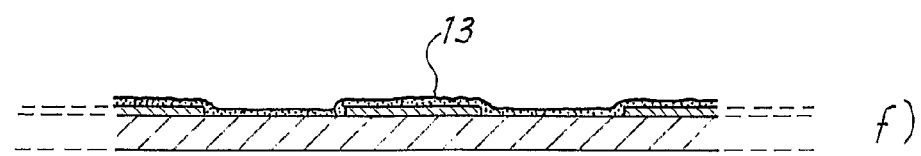
Figure 1:
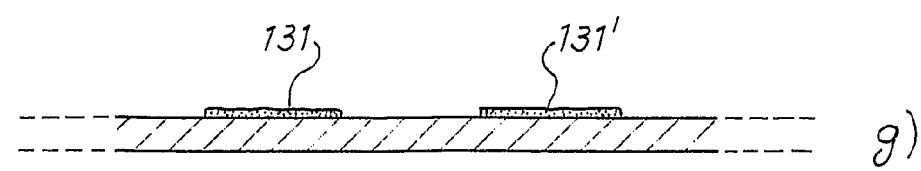

FIG. 1 shows, in cross-section, a support at various steps of the lift-off process. The dimensions in the drawing are not full-scale, and particularly heights and thicknesses are greatly increased for clarity purposes.

The first step of the lift-off process of the invention consists in the choice of the support 10 (FIG. 1a). The support can be metallic, ceramic, glass, quartz, or it can be made of a semiconductor material, possibly with a passivation layer (made, e.g., of silicon oxide or silicon nitride) on the surface, on which the subsequent operations will be carried out. The material choice depends on the final use of the getter device produced in the process. The material of most common use is mono- or polycrystalline silicon, which is commercially available in wafers of various diameters between about 10 and 30 cm with thicknesses from some tenths of a millimeter to about 1 mm.

The second step of the process consists in forming a layer of a photohardening polymeric material 11 (FIG. 1b) on support 10. Photohardening materials are known in the field under the name "photoresist." The layer 11 can produced "in situ" by uniformly distributing a liquid material on the support and by making it consolidate onto the support. Typically, this operation is carried out by "spin-coating," consisting in depositing a suitable amount of solution containing an organic material at the center of the support, setting the support in fast rotation so that the solution is spread, and making the solvent evaporate, leaving an even layer of the organic material on the support. The solvent evaporation is generally promoted by heating after formation of the layer is completed. It is also possible, especially in the case in which the support is not planar (e.g., if it is a partially processed part already showing cavities or relief portions), to produce the polymeric layer by spraying the solution on the support ("spray-coating"). Commercial products suitable for use in spin- or spray-coating are the solutions of MICROPOSIT® S-1800 series, by Shipley Company of Marlborough, Mass., USA. Alternatively, it is possible to use a so-called "dry-film," that is a polymeric film corresponding to the desired polymeric layer as to thickness and composition, which is uniformly adhered to the support by laying it off with a heated roll. A dry film suitable for the objects of the invention is the product ORDYL FP 325 sold by the company TOK Italia S.p.A. of Pogliano Milanese, Milan, Italy.

The layer 11 so laid is selectively made sensitive by lighting, through photolithographic methods well known in the field. In FIG. 1c the arrows indicate the light radiation (generally UV) and the dark parts of layer 11 are the zones photosensitized, i.e., having undergone such chemical variations that they have a solubility in a predefined solvent different from the solubility of the zones not exposed.

Then, the zones of layer 11 previously exposed (or those not exposed, depending on the solution) are selectively removed with a so-called "development solution." For example, if film 11 has been produced by spin- or spray-coating of a solution of the MICROPOSIT® S-1800 series, suitable development solutions are those of the MICROPOSIT® MF-300 series by Shipley Company, while in the case of use of ORDYL dry-film, a suitable solvent is a 1% by weight sodium carbonate aqueous solution. The result of this operation is shown in FIG. 1d, and consists of support 10 with a deposit 11 having apertures 12, 12', . . . .

The subsequent operation is the deposition of the getter material by sputtering, schematically represented in FIG. 1e, wherein the dots represent the particles of the material under deposition and the wavy arrows represent the depositing direction of these particles. This operation is the one characterizing the process of the invention. First of all, the sputtering deposition is not preceded by treatments of layer 11 directed to form recesses in the zones contacting the support, as in the processes of the prior art. Further, the deposition is carried out under conditions that are not typical for this technique, in particular with a working pressure in the chamber being of one or two orders of magnitude greater with respect to the values normally employed in the field and with a relatively low applied power. Thus, the pressure in the chamber during sputtering, when using argon, is comprised between about 1 and 5 Pa, preferably between about 1.5 and 4 Pa, and the power applied, working, for example, with a target of about 16.5 cm diameter, can vary between about 500 and 1000 W.

The support temperature and the distance between target and support are other deposition parameters. With respect to temperature, the support can be cooled during deposition. The target-support distance is greater than 40 mm and is preferably between about 50 and 80 mm. Also, this parameter is not typical of cathodic depositions, which are generally carried out with smaller target-support distances, e.g., of about 10 mm. Controlling these two parameters is, however, not necessary for the purposes of the invention, in contrast to chamber pressure and specific power.

In order to increase the porosity of the deposited getter material layer, it is also possible to arrange the target and support so that the facing surfaces thereof are not parallel, and to move (rotate, for example) the support during the deposition.

During the deposition operation, it is possible to form layers of simple metals like titanium, but these generally require, for the activation of the getter functionality, thermal treatments under vacuum (or inert gas) at high temperatures, which may not be compatible with the final device for which the getter device is intended. Alternatively, it is possible to deposit layers of alloys containing zirconium, cobalt and Rare Earths, such as the ones described in U.S. Pat. No. 5,961,750, and particularly the alloy with the percentage composition by weight Zr 80%—Co 15%—Rare Earths 5%, sold by SAES Getters S.p.A. with the designation St 787; or alloys or compounds containing zirconium, vanadium and/or titanium. It is also possible to produce double layer getter deposits, such as those described in European patent application publication EP 1,518,599.

The result of the operation schematically represented in FIG. 1e is shown in FIG. 1f. A thin layer 13 of getter material is obtained, covering both the zones of support 10 corresponding to apertures 12, 12', . . . , and the portions of polymeric layer 1 not previously removed.

Finally, the last step of the process of the invention consists in the removal with a solvent of the portions of polymeric deposit 11 still present on support 10.

As previously described, this operation is the one which is practically impossible to carry out in the prior art processes, unless the particular expedients cited are used, especially the formation of an "undercut" under layer 11 at the periphery of apertures 12, 12', . . . . In contrast, the present inventors have observed that by carrying out the sputtering operation under the particular above-described conditions, the removal of layer 11 with the solvent occurs in an effective manner, without using the particular expedients. As a solvent for the removal of layer 11 it is possible to use products of the MICROPOSIT® REMOVER series, if the layer has been produced from MICROPOSIT solutions, or a sodium hydroxide solution at 40-50° C. in the case of ORDYL dry-film. The final result of the operation, and of the whole process, is the support 10 with localized deposits 131, 131', . . . , shown in FIG. 1g. Deposits 131, 131', . . . can have a minimum thickness of about 0.5 µm. In fact, it has been observed that with lower thicknesses the gas sorption properties are excessively reduced, perhaps due to the fact that too thin deposits tend to reproduce the morphology of the surface on which they grow, with the result that they are too smooth and compact to have good sorption characteristics. The maximum thickness is, on the contrary, determined by compromise considerations between having a sorption ability compatible with the desired application, and the time (and thereby the cost) of the formation of the deposit. In addition, deposits being excessively thick tend to detach from the support. Suitable deposits for the invention have maximum thicknesses of about 20 µm, and preferably comprised between about 1 and 5 µm.

Optionally, the process of the invention comprises a further step between the step of forming in the polymeric layer at least a cavity with a first solvent, and the step of depositing the getter material by sputtering. This further optional step is a thermal treatment of the portion of the polymeric layer left on the support by the previous treatment of removal with the first solvent. This operation has the result of hardening the polymer, so that during the subsequent deposition of the getter by sputtering, the polymer has better mechanical characteristics and thus improved capability to maintain the pattern obtained during the selective removal with the first solvent. Though it is not commonly carried out in lift-off processes, this operation is known in the field of processes of deposition of thin films, and referred to, for instance, as "post-development baking." The temperature required to carry out this operation depends on the chemical nature of the polymer. With the materials described previously, this operation may range between about 100 and 150° C.

FIG. 2 is the reproduction of a photograph, obtained with an optical microscope, of a portion of a support of the type 10 on which getter material deposits of complex geometry have been obtained with the process of the invention. In the drawing, the various getter deposits are altogether indicated as element 20, while zones of the surface of the support (silicon, in this case) resulting in being exposed at the end of the lift-off process are indicated as 21. As shown in the drawing, the deposits have clear and straight edges, confirming the high precision of dimensioning and positioning of the individual deposits, which it is possible to obtain with the process of the invention. In particular, the deposits shown in the drawing have a thickness of about 2 µm, the zones of deposits 20 having elongated linear shape have a width of about 120 µm, while the exposed zones 21 have a width of about 100 µm. These dimensions, particularly the lateral ones, as well as the positioning precision shown in the drawing, could not be obtained in a precise and reproducible way with other methods of getter material layer deposition.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A lift-off process for formation of miniaturized getter deposits comprising the following steps:
    forming a layer of a photosensitive polymer on a support;
    selectively exposing to light a first portion of the polymer layer to cause a chemical modification in the polymer portion and leaving a second portion unexposed;
    removing with a first solvent only one of the first and second portions to form in the polymer layer at least one cavity whose bottom wall comprises a surface of the support;
    forming by cathodic deposition a thin layer of a getter material on the bottom wall of the cavity and on the portion of the polymer layer not removed by the first solvent; and
    removing with a second solvent the polymer portion not removed by the first solvent, leaving at least the getter material deposit on the support surface;
    wherein the cathodic deposition is not preceded by either operations or treatments for formation of recesses in a lower part of the polymer layer, and wherein the cathodic deposition is carried out with a chamber pressure between about 1 and 5 Pa and with a specific power between 6 and 13 W per square centimeter of area of a surface of a target actually interested by plasma for the deposition.

2. The process according to claim 1, wherein a distance between the target and the support during the cathodic deposition is greater than 40 mm.

3. The process according to claim 2, wherein the distance is between 50 and 80 mm.

4. The process according to claim 1, wherein the support is cooled during the deposition.

5. The process according to claim 1, wherein the support comprises a material chosen among metal, ceramics, glass, quartz, and a semiconductor material.

6. The process according to claim 5, wherein the material comprises mono- or polycrystalline silicon.

7. The process according to claim 1, wherein the formation of the polymer layer is carried out by depositing at a center of the support a predefined amount of a solution containing a third solvent and an organic material capable of forming the polymer layer on the support upon removal of the third solvent, setting the support in fast rotation so that the solution is spread on the support, and evaporating the third solvent.

8. The process according to claim 1, wherein the formation of the polymer layer is carried out by spraying on the support a solution containing a third solvent and an organic material capable of forming the polymer layer on the support upon removal of the third solvent.

9. The process according to claim 1, wherein the formation of the polymer layer is carried out by uniformly adhering a polymeric film, corresponding in thickness and composition to the polymer layer desired, to the support surface by a heated roll.

10. The process according to claim 1, wherein the pressure in the chamber during the cathodic deposition is between about 1.5 and 4 Pa.

11. The process according to claim 1, wherein during cathodic deposition the support surface is maintained not parallel to the target surface and is kept in movement with respect the target surface.

12. The process according to claim 1, wherein the getter material comprises a material chosen among titanium; alloys containing zirconium, cobalt and Rare Earths; alloys containing at least one of zirconium, vanadium and titanium; and compounds containing at least one of zirconium, vanadium and titanium.

13. The process according to claim 1 further comprising, between the step of removing with a first solvent and the step of depositing the getter material by cathodic deposition, a step of thermal treatment of the portion of the polymer layer not removed to a temperature effective to cause hardening of the polymer.

14. The process according to claim 13, wherein the temperature is in a range between about 100 and 150° C.

* * * * *